United States Patent [19]

Chiao et al.

[11] Patent Number: 4,868,617
[45] Date of Patent: Sep. 19, 1989

[54] GATE CONTROLLABLE LIGHTLY DOPED DRAIN MOSFET DEVICES

[75] Inventors: Stephen S. Chiao, Saratoga; Wung K. Lee, San Jose, both of Calif.

[73] Assignee: Elite Semiconductor & Sytems International, Inc., San Jose, Calif.

[21] Appl. No.: 185,719

[22] Filed: Apr. 25, 1988

[51] Int. Cl.⁴ .......................................... H01L 29/78
[52] U.S. Cl. ................................. 357/23.3; 357/91; 357/54; 357/59; 357/23.14
[58] Field of Search ............... 357/23.3, 91, 54, 59 G, 357/59 I, 23.14

[56] References Cited

U.S. PATENT DOCUMENTS

| | | | |
|---|---|---|---|
| 4,363,696 | 12/1982 | Nagakubo et al. | 357/596 X |
| 4,597,824 | 7/1986 | Shinada et al. | 357/23.4 X |
| 4,654,680 | 3/1987 | Yamazaki | 357/23.14 X |
| 4,746,219 | 5/1988 | Holloway et al. | 357/67.5 X |

OTHER PUBLICATIONS

Sai-Halasz et al., "Simple Realization of an Edge-Doped FET," *IBM Technical Disclosure Bulletin*, vol. 26, No. 6, Nov. 83, 3025-6.
Ting, "Silicide for Contacts and Interconnects," *IEDM*, 1984, pp. 110-113.

*Primary Examiner*—Rolf Hille
*Assistant Examiner*—William A. Mintel
*Attorney, Agent, or Firm*—Rosenblum, Parish & Bacigalupi

[57] ABSTRACT

An LDD MOSFET structure in which gate sidewall spacers are formed of polycrystalline silicon and electrically shorted to the gate to extend gate control over the LDD region surface oxide and thereby reduce and control interface charge trapping without increasing substrate currents.

9 Claims, 7 Drawing Sheets

GATE CONTROLLABLE LIGHTLY DOPED DRAIN MOSFET DEVICES

BACKGROUND OF THE INVENTION

1. Field of the Invention

The present invention relates generally to semiconductor devices and more particularly to lightly opened drain MOSFET devices.

2. Discussion of the Prior Art

Conventional metal oxide semiconductor (MOS) field effect transistors (FETs) operate with a channel conducting a current having a maximum lateral electrical field just inside the channel junction to the drain. These channel maximum fields accelerate and inject "hot carriers" towards and into the interface of the gate oxide layer over the drain junction, where many hot carriers become trapped as interface states. Interface trapped charge fields oppose the biased gate and drain fields, thereby reducing channel charge mobility, transconductance Gm, drain-to-source current Ids, increasing the switching voltage threshold Vt, and facilitating source-drain breakdown, of the MOSFET. However, in conventional MOSFETs, trapped charge interface state effects are mitigated by the gate overlapping the channel junctions with the source and drain, and overlapping the substrate surface (gate) oxide into which hot carriers are most often injected and trapped. The gate bias counterbalances the field of any trapped charges and partially restores the conductivity of the underlying channel and drain regions.

Figure 1:
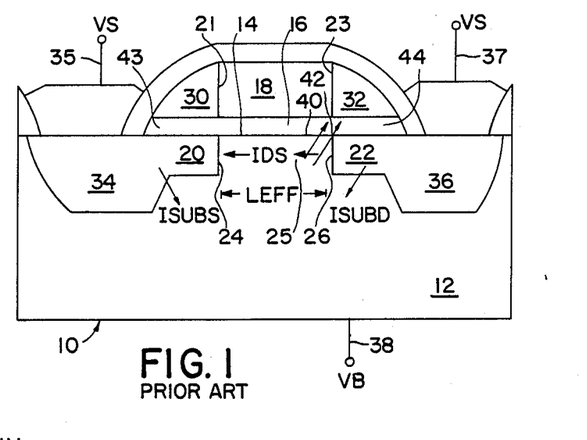
FIG. 1 illustrates a prior art LDD device with oxide sidewall spacers over LDD regions.

Conventionally, MOSFET channel maximum lateral electric fields have been reduced through the use of graded or double drain structures such as double diffused drain (DDD) or lightly doped drain (LDD) structures. FIG. 1 illustrates a typical prior art LDD N-channel MOSFET 10 formed from a P-type silicon substrate 12 having an initial upper surface 14 which supports a dielectric layer 16 and 43, 44 which in turn supports a layer of polycrystalline silicon. The polysilicon layer is then etched to leave gate electrode 18 over gate dielectric 16, and a low dosage (around $1E13$ atoms/cm$^2$) of phosphorus is implanted through the exposed LDD surface dielectric 43, 44 into surface 14 to form lightly N-doped LDD regions 20 and 22 in substrate 12. Gate sidewalls 21 and 23 self-align LDD region junctions 24 and 26 to substrate channel 25 with an effective length Leff. Next, two to four thousand angstroms of spacer oxide film is deposited over the structure, and anisotropically etched away to leave gate sidewalls 21 and 23 flanked with oxide spacers 30 and 32 over LDD surface oxide 43 and 44, which shield respectively underlying LDD regions 20 and 22, and to expose surface 14 outside of spacers 30 and 32. Then, the substrate surface 14 is implanted with a heavy dosage (around $5E15$ atoms/cm$^2$) of arsenic, which supplements the phosphorus implant, to form a regularly (N++) doped source region 34 and a regularly (N++) doped drain region 36, which are self-aligned to the outer edges of oxide spacers 30 and 32 and thus offset from channel junctions 24 and 26 by the respective LDD regions 20 and 22 underlying spacers 30 and 32. Lightly doped drain region 22 extends from regular heavily doped drain region 36 to junction 26 with channel 25, and lightly doped source (also "LDD") region 20 extends from the channel's opposite junction 24 to regular heavily doped source region 34. (See "Fabrication of High-Performance LDD-FETs with Oxide Sidewall Spacer Technology" IEEE Trans. Electron Devices, ED-29, pp. 590-596 (1982)).

An N-channel MOSFET 10 is normally operated by applying a positive voltage (approximately 5 V) Vg to the terminal (not shown) of gate 18, a positive voltage (approximately 5 V) Vd to terminal 37 of drain region 36, a zero (ground) voltage Vs to terminal 35 of source region 34, and a zero or negative voltage Vb to terminal 38 of substrate 12. Current Ids flows from drain 36 through channel 25 to source 34.

The LDD device 10 channel maximum lateral electric field, though less than in non-LDD MOSFETs, injects some channel hot carriers along trajectory 40 over LDD junction 26 into the overlying gate oxide 16 and, more than in non-LDD structures, also injects channel hot carriers along trajectory 42 through LDD junction 26 and on upwards into LDD surface oxide 44 on the outside of gate sidewall 23. Over LDD regions, injected hot carriers are more likely to be trapped on, and deplete, the LDD-oxide surface 14 interface than are trapped carriers in non-LDD devices. Charge carriers trapped in LDD oxide 44 are outside the influence of, and not counterbalanced by, the opposing bias on gate 18. In an LDD structure 10, even with only a minor quantity of charge trapped in the LDD surface oxide 44 interface, the LDD region light doping and proportionately weak conductivity is proportionately more offset to a substantially higher resistance. During device 10 operation, ongoing charge trapping gradually increases the LDD region 22 parasitic series resistance, which again degrades the transconductance Gm, switching voltage threshold Vt, and current driveability of device 10.

Figure 2:
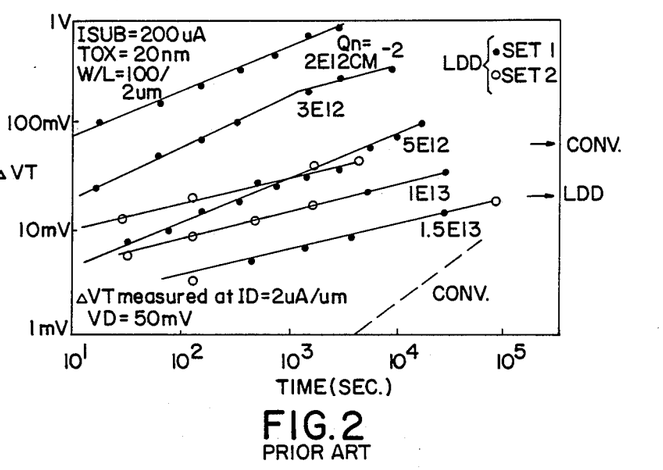
FIG. 2 illustrates the threshold voltage shifts ΔVt versus time under equal substrate current stressings for prior art LDD devices and for a prior art non-LDD arsenic device.

Referring to FIG. 2, threshold voltage shifts $\Delta$Vt for conventional LDD MOSFETs 10 are typically greater (worse) than for conventional non-LDD MOSFETs when both are stressed at voltages producing equal substrate currents (Isub). (See "Evaluation of LDD MOSFETs based on Hot-Electron-Induced Degradation," IEEE Electron Device Letters, Vol. EDL-5, pp. 162-165 (1984)).

Figure 3:
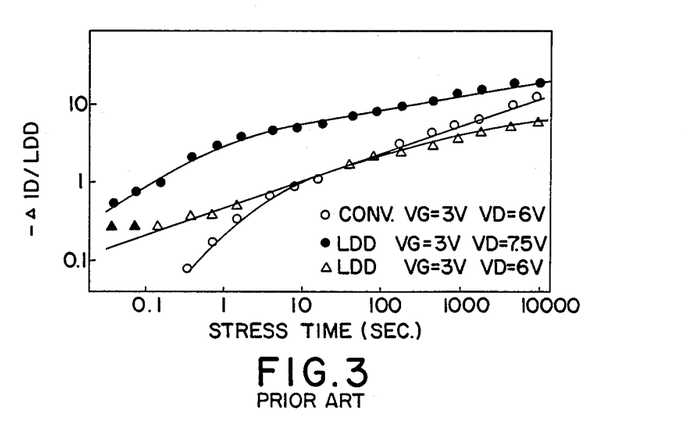
FIG. 3 illustrates the stress-time dependance of the drain current reduction ΔId for prior art LDD devices and for a prior art non-LDD arsenic device.

As shown in FIG. 3, over time, the stress-dependent increase in the LDD series resistance reduce the drain current Id (see "Mechanism of Hot Electron Induced Degradation in LDD NMOS-FET" IEDM, pp. 786-789 (1984)).

Figure 4:
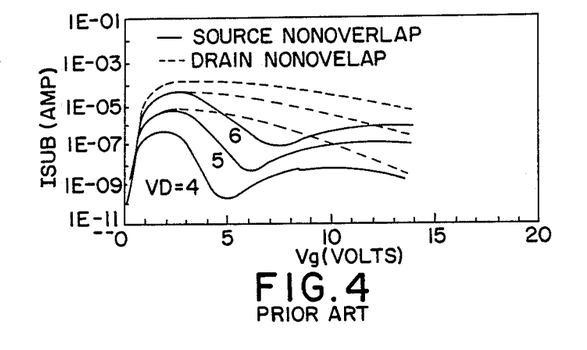
FIG. 4 illustrates the gate voltage versus substrate current characteristic with the drain voltage as a parameter for prior art LDD devices.

In addition, the problem of "weak gate-to-source/-drain overlap" is encountered in fabrication techniques which implant ions at a tilt or implant ions in low (N-) concentrations of around $1.0E13$ atoms/cm$^3$. Substrate wafer periphery MOSFETs (not shown) are implanted with ions on trajectories angled at approximately seven degrees, and thus gate electrode 18 shadows, and "weakly overlaps," either the source region 34 or drain region 36. A highly biased gate 18 with a weak-or non-overlap over the junction of the source or drain establishes a high electric field which generates hot electrons and causes anomalous "double humps" in substrate current Isub as shown in FIG. 4 (See IEEE Electron Device Letters, Vo. EDL-7 No. 1, pp. 16-19 (1986)).

LDD device 10 conductivity losses have conventionally been accommodated by increasing the concentration of (N-) dopant in LDD regions 20 and 22. In conventional non-LDD arsenic-only MOSFETs, the drain region 36 is heavily N++ doped. Unfortunately, increasing the concentration of dopant in the drain also increases the strength of the electric field beyond junction 26 in substrate 12, increases the junction 26 depletion zone encroachment into channel 25, aggravates the "short channel effect" and the parasitic resistance due to post drive-in diffusion of junctions, and exponentially increases the drain 36-to-substrate 12 current Isubd. When Vd>Vg and device 10 is operating in saturation mode, substrate current Isubd is quite pronounced. Increased substrate current degrades (raises the LDD MOSFET 10 switching voltage threshold Vt, lowers the drain punch-through voltage, and can trigger bipolar "snap-back" latch-up.

Thus, there is a need for an LDD MOSFET structure which reduces and controls interface charge trapping without increasing the substrate currents.

SUMMARY OF THE PRESENT INVENTION

The present invention provides LDD MOSFET devices with gate control over electric fields in lightly doped source and drain regions to alleviate oxide interface trapped charge effects and to thereby improve device reliability.

LDD MOSFETS according to the invention in first and second preferred embodiments are both fabricated by processes beginning with a substrate of monocrystalline silicon covered with a layer of gate oxide dielectric and a layer of polycrystalline silicon. The polysilicon and oxide dielectric layers are patterned and the substrate is implanted with a light dosage of ions to form LDD regions as in conventional processes of fabricating LDD MOSFETs.

In contrast to the prior art, sidewall spacers are formed in the present invention with conductive, preferably polysilicon, material and with ohmic connections to the gate electrode, enabling the gate to exert its electric field on the LDD surface oxide dielectric over the LDD regions where hot carriers are commonly injected, and to thereby modulate the conductivity of the underlying LDD regions.

Further, the LDD surface oxide dielectric layer is preferably thinned to reduce the volume of oxide where hot carriers may be trapped over the LDD regions.

The conductive spacers and thinner LDD surface oxide both decrease the parasitic resistance and increase the transconductance Gm, current driveability, and speed of devices according to this invention. This in effect permits forming LDD and regular source and drain regions with reduced concentrations of dopants, which reduces the drain-to-substrate current Isubd, and shallower and more abrupt junctions with less depletion-zone encroachment into the channel and lower parasitic capacitances and resistances. Decreasing Isub raises the punch-through voltage.

The invention preferably further provides the conductive spacer's outer sides with small oxide spacers so that gate control can extend over the LDD regions and eliminate the possibility of non or weak gate-to-source or-to-drain overlap without increasing the respective overlap capacitances compared to conventional LDD MOSFETs. The invention is thereby able to provide a constant low field between the gate and the source and to avoid "double-humps" in the source-to-substrate current Isubs.

BRIEF DESCRIPTION OF THE DRAWING

FIG. 8 and 9a through 16a illustrate steps in a process for manufacturing a first embodiment of gate controllable LDD devices according to the present invention.

FIGS. 9b through 16b, 17 and 18 illustrate steps in a process for manufacturing a second embodiment of a gate controllable LDD device according to the present invention;

DETAILED DESCRIPTION OF THE PREFERRED EMBODIMENTS

Figure 5:
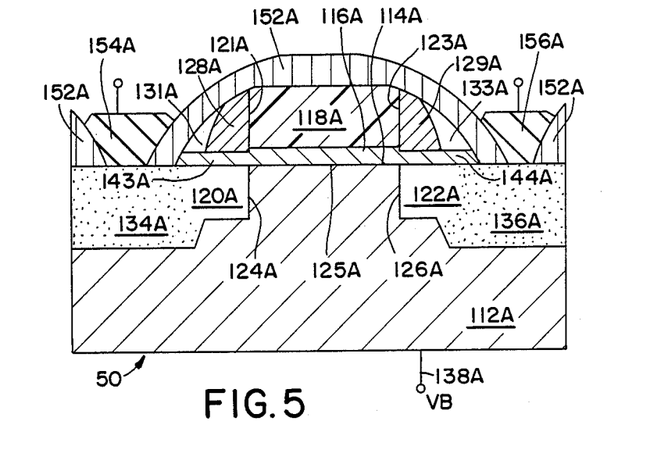
FIGS. 5 and 6 illustrate cross-sections of the invention in first and second embodiments, respectively.
Figure 6:
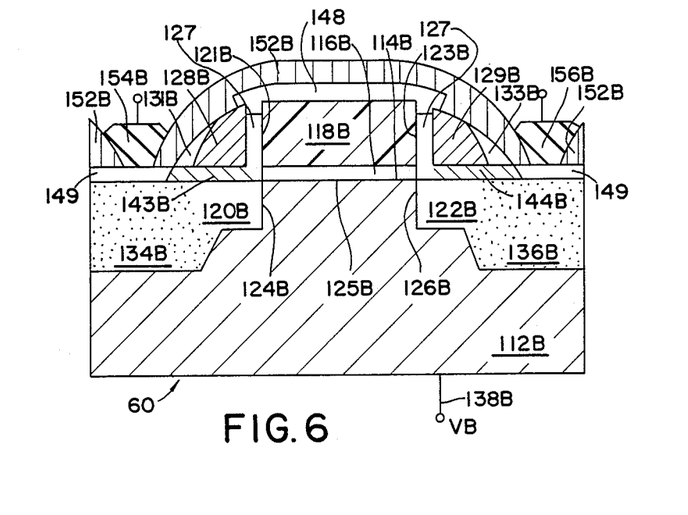

The present invention is illustrated in a first preferred embodiment as LDD MOSFET structure 50 in FIG. 5 and in a second preferred embodiment as LDD MOSFET structure 60 in FIG. 6. Features of first embodiment structure 50 and of second embodiment structure 60 are numbered 100 higher than certain corresponding features of prior art LDD MOSFET 10 in FIG. 1. Structure 50 feature numbers have the suffix "a", and structure 60 feature numbers have the suffix "b".

FIG. 5 LDD MOSFET 50 and FIG. 6 LDD MOSFET 60 include, for example, a respective P-type silicon substrate 112a, 112b having an initial planar top surface 114a, 114b, a gate oxide dielectric layer 116a, 116b, a polycrystalline silicon gate electrode 118a, 118b with left sidewall 121a, 121b and right sidewall 123a, 123b, a lightly N-doped source extension (LDD) region 120a, 120b, and a lightly N-doped drain extension (LDD) region 122a, 122b. The gate sidewalls self-align LDD source region junction 124a, 124b and LDD drain region junction 126a, 126b, to define between them a substrate channel 125a, 125b. LDD surface oxide dielectric layer 143a, 143b covers surface 114a, 114b over LDD source region 120a, 120b, and LDD surface oxide dielectric layer 144a, 144b covers surface 114a, 114b over LDD drain region 122a, 122b.

FIG. 6 device 60 gate sidewalls 121b and 123b are bordered by etch stop oxide 127. FIG. 5 device 50 gate sidewalls 121a and 123a and FIG. 6 device 60 etch stop oxide 127 are bordered by polycrystalline silicon spacers 128a, 128b over LDD source regions 120a, 120b, and by polycrystalline silicon spacers 129a, 129b over LDD drain regions 122a, 122b. The poly spacer 128a, 128b outer sides are covered with small oxide spacers 131a, 131b, and the poly spacer 129a, 129b outer sides are covered with small oxide spacers 133a, 133b. The outer side of oxide spacer 131a, 131b self-aligns a regular heavily N++ doped source region 134a, 134b, and the outer side of oxide spacer 133a, 133b self-aligns a regular heavily N++ doped drain region 136a, 136b.

In device 60, gate 118b and poly spacers 128b and 129b are connected by silicide 148, and contact surfaces 114b of source region 134b and of drain region 136b are covered by silicide 149.

FIG. 5 gate electrode 118a, conductive poly spacers 128a and 129a and oxide dielectric spacers 131a and 133a are covered with insulating layer 152a. FIG. 6 silicide 148 and oxide dielectric spacers 131b and 133b are covered with insulating layer 152b.

Figure 7:
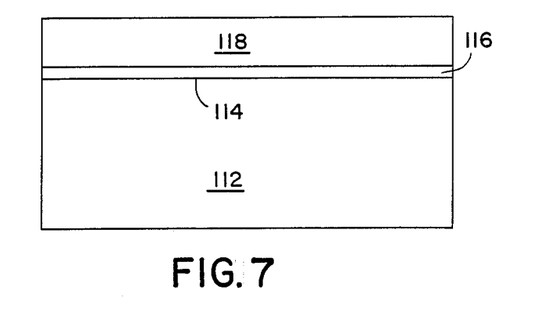
FIG. 7 illustrates a substrate upon which either embodiment of the invention may be formed.

LDD MOSFET devices 50 and 60 are both preferably fabricated by processes beginning with a monosilicon substrate 112 doped with P-type dopants to a resistivity in the range of 10 to 60 ohm-cm$^2$, having an initial planar top surface 114 which is then covered with typically 250 angstroms of thermally grown gate oxide dielectric 116. Over gate oxide layer 116, polysilicon 118 is deposited to a thickness of several thousand angstroms and doped with N+ impurities.

Following the step of FIG. 7, substrate 112 with oxide 116 and polysilicon 118 is processed through steps illustrated in FIGS. 8, 9a and 11a–16a to form LDD MOSFET 50 of FIG. 5. Alternatively, the FIG. 7 substrate and overlying layers are processed through a mainly corresponding sequence of steps illustrated in FIGS. 9b, 10, 11b–16b, 17 and 18 to form LDD MOSFET 60 of FIG. 6.

Figure 8:
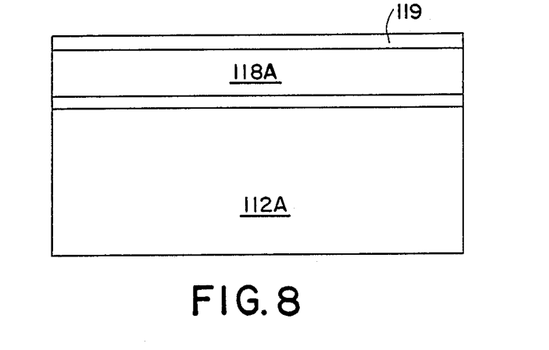

For device 50, referring to FIG. 8, a thin layer of etch stop oxide 119 is deposited or thermally grown.

Next, photoresist is deposited over etch stop oxide 119 (FIG. 9a) or over polysilicon 118b (FIG. 9b) and patterned to leave mask 117a, 117b. The unmasked areas of the surfaces of etch stop oxide 119 and polysilicon 118a, 118b are removed, preferably by a highly selective (polysilicon versus oxide) anisotropic plasma etching process, such as a CL2 process, which thins, yet minimizes the loss of, gate oxide 116a, 116b to leave LDD source surface oxide 143a, 143b and LDD drain surface oxide 144a, 144b. Afterwards, photoresist mask 117a, 117b is removed.

Figure 9A:
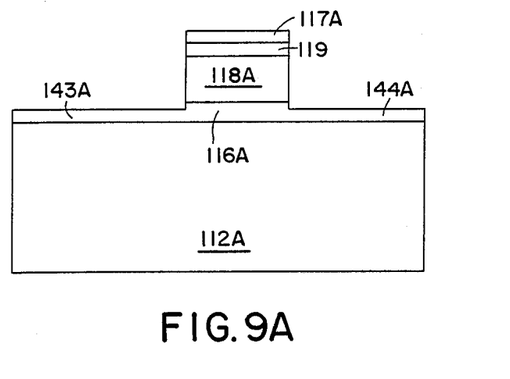
Figure 9B:
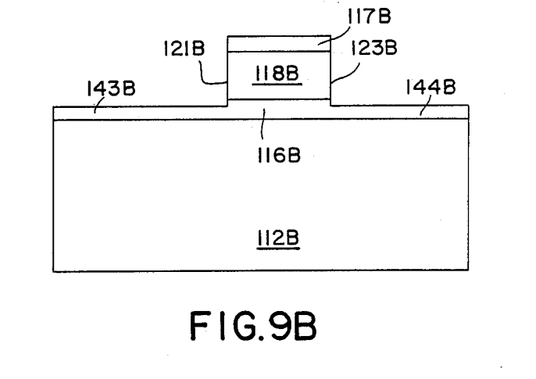
Figure 10:
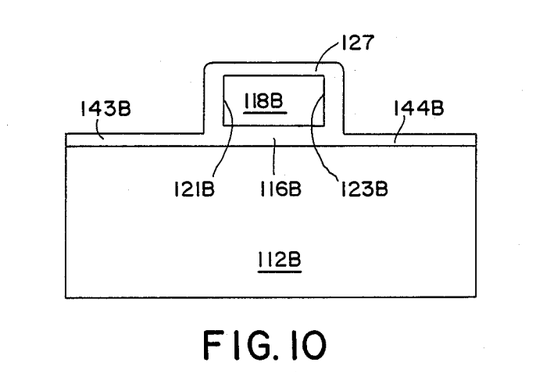

The FIG. 9b structure is, in the step of FIG. 10, thermally oxidized to grow typically 250 angstroms of etch stop oxide 127 on gate sidewalls 121b and 123b and to regrow thinned LDD surface oxide 143b, 144b. The FIG. 9b LDD surface oxide 143b, 144b etch selectivity and over-etch tolerances are relieved by the FIG. 10 step of regrowth to a selected thickness to compensate for possibly over thinned LDD surface oxide and to later determine the hot carrier reliability and current driveability of LDD MOSFET 60.

Figure 11A:
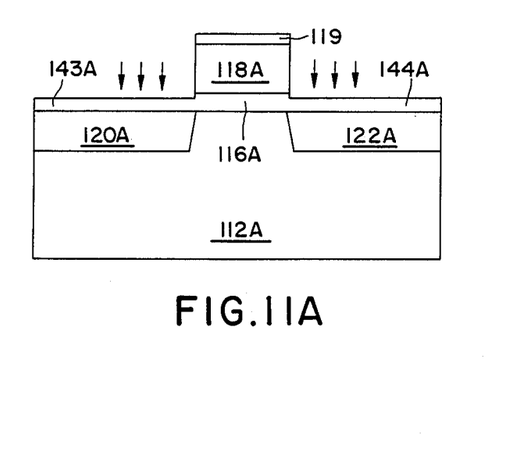
Figure 11B:
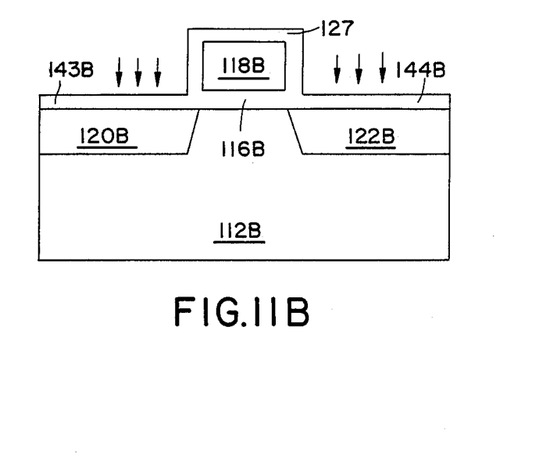
Figure 12A:
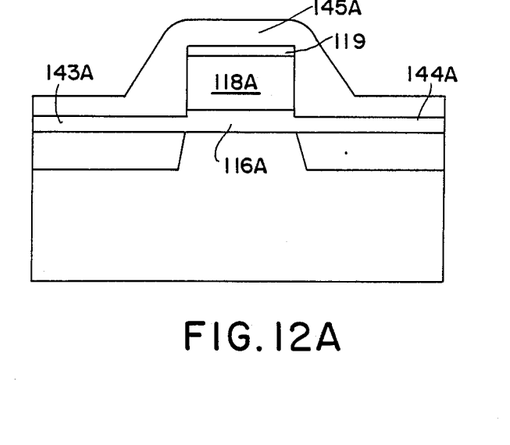
Figure 12B:
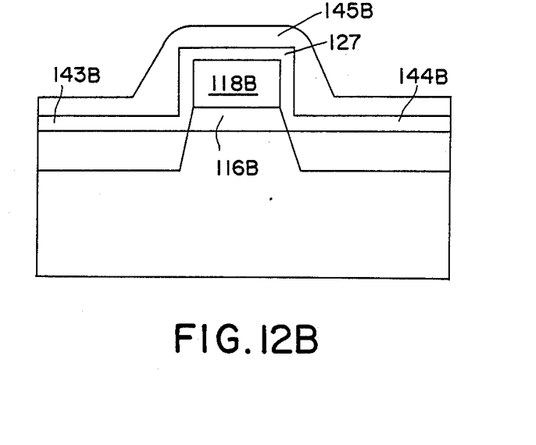

Next, as indicated by the downward directed arrows in FIGS. 11a and 11b, substrate 112a, 112b is implanted with a selected low dosage (typically to a concentration of 1.0E13 atoms/cm$^2$) of phosphorus or of arsenic to form an N-LDD source extension 120a, 120b beneath LDD surface oxide 143a, 143b, and to form an N-LDD drain extension 122a, 122b beneath LDD surface oxide 144a, 144b. Next, as shown in FIGS. 12a and 12b, polysilicon is deposited to a depth of several thousand angstroms in a layer 145a, 145b and doped with N+ (phosphorus) ions.

Figure 13A:
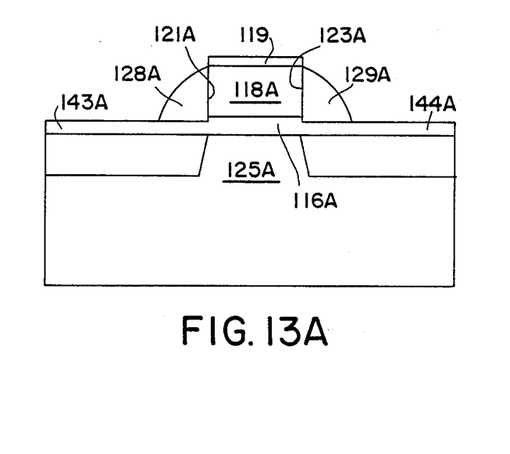
Figure 13B:
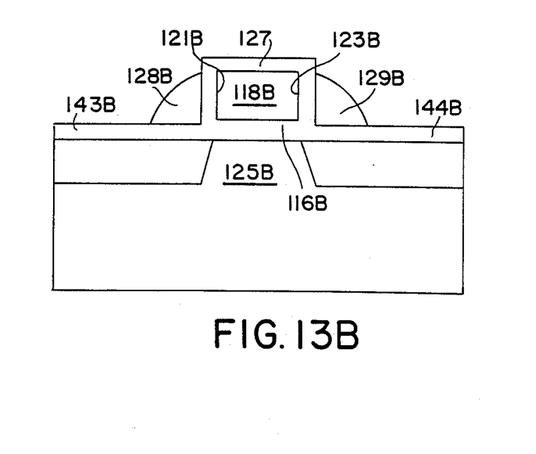

Polysilicon layer 145a, 145b is then anisotropically plasma etched to remove exposed horizontal surfaces of polysilicon while retaining vertical surfaces of polysilicon and thereby forming conductive poly spacer 128a adjacent gate sidewall 121a and forming conductive poly spacer 129a adjacent sidewall 123a in FIG. 13a, or forming conductive poly spacers 128b and 129b adjacent etch stop oxide 127 which surrounds sidewalls 121b and 123b of gate 118b in FIG. 13b. FIG. 13a polysilicon spacers 128a, 129a are electrically shorted to respective sidewalls 121a and 123a of gate 118a. FIG. 13b polysilicon spacers 128b and 129b are electrically isolated by etch stop oxide 127 from the sidewalls 121b and 123b of gate 118b. The FIG. 13a etch stop oxide 119 and the FIG. 13b etch stop oxide 127 provide "end points" to stop the anisotropic etching from reaching the respective gate 118a, 118b. The polysilicon spacer widths are determined by the height of gate 118a, 118b, the thickness of polysilicon film 145a, 145b, and the anisotropic etch back process, which are all controllable in contemporary techniques for fabricating MOSFETs. The polysilicon spacer 128, 129 width is typically around 0.2 microns to optimize the channel 125a, 125b electric field, hot carrier reliability, and current driveability. The FIG. 13a poly spacers 128a, 129a overlie LDD surface oxide dielectric 143a, 144a which was selectively over-etched during the FIG. 9a step of plasma etching to be several tens of angstroms thinner than the initial oxide dielectric 116a. The FIG. 13b poly spacers 128b, 129b overlie LDD surface oxide 143b, 144b which was, in the step of FIG. 10, regrown to a lesser thickness than the initial oxide dielectric layer 116b. The thinner LDD surface oxide 143a,b, and 144a,b improves the device 50 and 60 hot carrier reliability and transconductance.

Figure 14A:
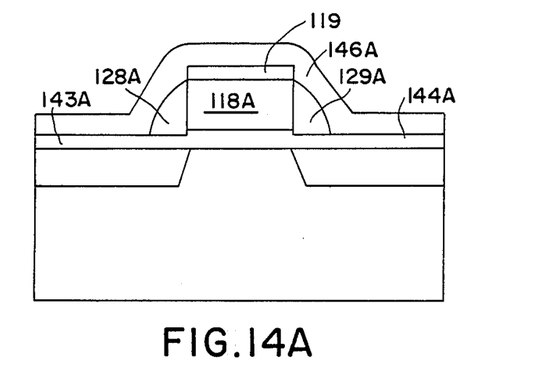
Figure 14B:
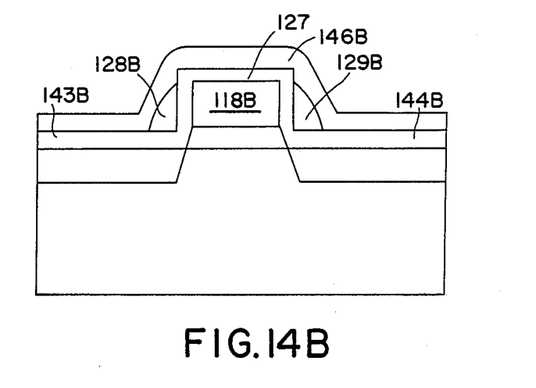
Figure 15A:
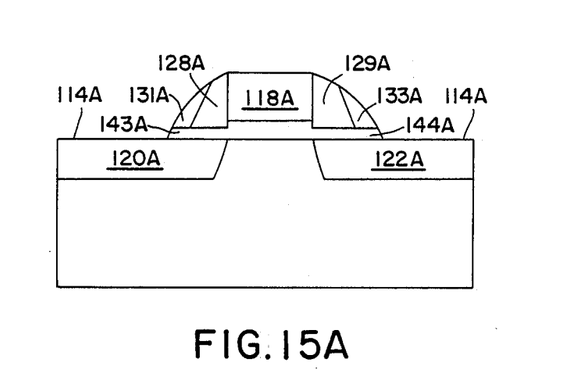
Figure 15B:
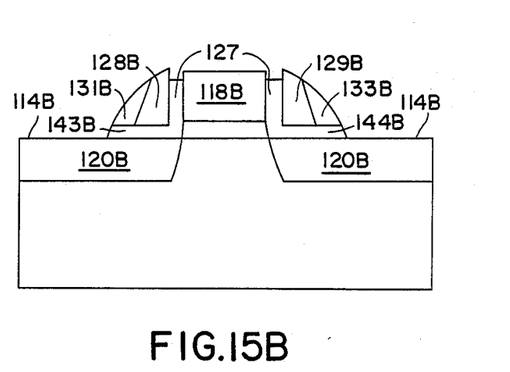

After the formation of the polysilicon spacers, referring to FIGS. 14a and 14b, spacer oxide is thermally grown and/or deposited to a thickness of several thousand angstroms in a layer 146a, 146b on the exposed polysilicon spacer surfaces. As shown in FIGS. 15a and 15b, spacer oxide layer 146a, 146b is then anisotropically plasma etched to remove exposed areas of etch stop oxide 119, 127 and LDD surface oxide 143a,b and 144a,b over the flat surfaces of substrate regions intended to be formed into source and drain regions, while leaving small oxide spacers 128a, 128b and 129a, 129b along the outer walls of the polysilicon spacers. The spacer oxide width can be adjusted to minimize the gate-to-drain and gate-to-source overlap capacitances without compromising the hot carrier reliability of devices 50 and 50.

Figure 16A:
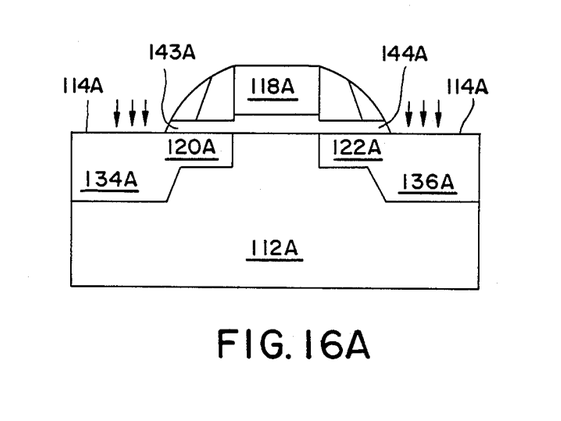
Figure 16B:
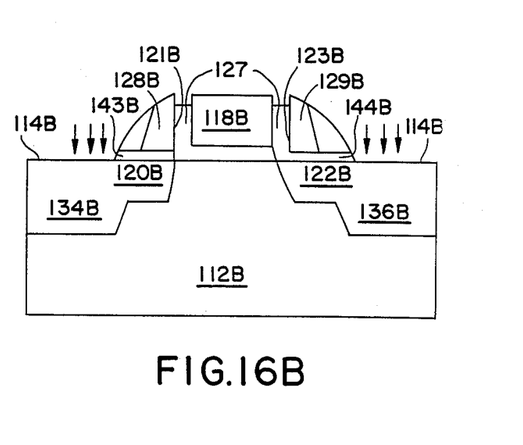

Referring to FIGS. 16a and 16b, a high dosage of around 5E15 atoms/cm$^3$ of arsenic or phosphorus is then implanted as indicated by the downward directed arrows to form N++ source region 134a, 134b and N++ drain region 136a, 136b abutting respective lightly doped LDD source and drain extensions 120a, 120b and 122a, 122b.

Figure 17:
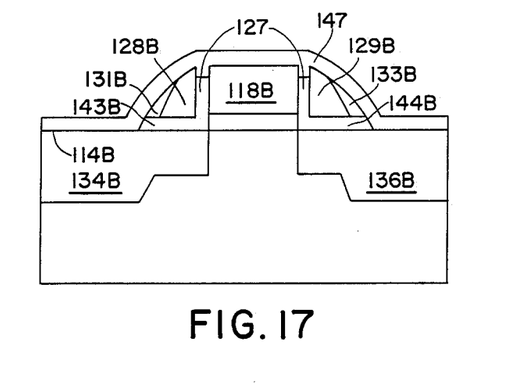

Referring to FIG. 16b, parts of etch-stop oxide layer 127 remain adjacent gate sidewalls 121b and 123b and thus isolate gate 118b from polysilicon spacers 128b and 129b. Gate 118b and poly spacers 128b and 129b are then connected preferably as shown in FIG. 17 by sputter depositing a refractive metal such as titanium (Ti) or molybdenum (Mo) in a layer 147 over the surface of device 60, and thermally reacting layer 147 to form silicide 148 over the exposed polysilicon gate 118b, poly spacers 128b, 129b, and the source 134b and drain 136b surfaces 114b. The reacted material is then annealed. Afterwards, in the step of FIG. 18, the unreacted material is stripped off by wet chemical etching to leave silicide 148 shorting the gate 118b top to the polysilicon spacers to control conductive poly spacers 128b, 129b and to leave layers 149 over the surfaces 114b of the source 134b and drain 136b, which reduce the resistance and increase the speed and reliability of device 60. Although not shown, silicide can similarly be used to reduce source and drain contact resistance in device 50.

Figure 18:
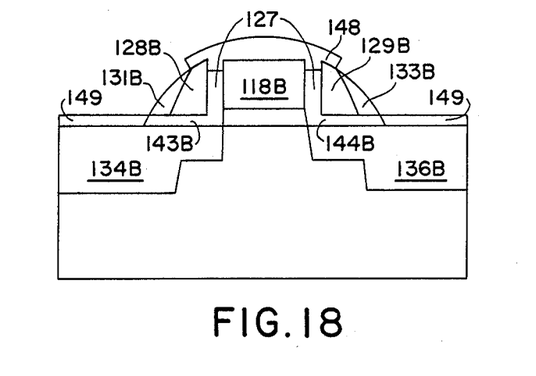

The structures of FIG. 16a and of FIG. 18 are both preferably completed by well known MOSFET fabrication process steps of forming surface passivation 152a, 152b, forming contact windows through passivation 152a, 152b, and filling the windows with source contacts 154a, 154b and drain contacts 156a, 156b to produce devices 50 and 60 as shown in FIGS. 5 and 6.

Figure 19:
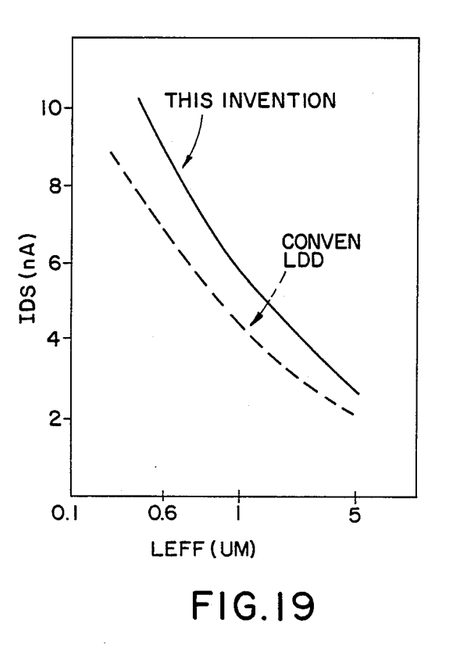
FIG. 19 illustrate the improvement of drain saturation current in the present invention as compared to prior art LDD devices.

The LDD source and drain extensions and conductive spacers reduce the channel maximum lateral electric field. Device 50 poly spacers 128a, 129a and device 60 poly spacers 128b, 129b modulate and reduce the parasitic resistance of the underlying N-regions 120a, 122a and 120b, 122b and therefore an abundance of mobile carriers (electrons) are generated in the substrate close to the interface between device 50 LDD surface oxide 143a, 144a or device 60 LDD surface oxide 143b, 144b. The polysilicon spacer's underlying thin surface oxide is less likely to trap hot carriers than are conventional thicker oxide spacers, and most of the hot electrons injected towards the gate will be collected by the polysilicon spacers. The gate-controlled spacers and the thin LDD surface oxide 143, 144 together increase the device transconductance Gm and drain current Id. The LDD resistance reduction allows reducing the N-dosage, which in turn permits very shallow and abrupt junctions. Abrupt arsenic junctions further reduce the parasitic resistance and, particularly in sub-micron devices; alleviate short channel effects such as lowered threshold voltage Vt and lowered punch-through voltage, and thereby allow shortening the channel's effective length Leff. FIG. 19 illustrates the drain saturation current (driveability) improvement as a function of effective channel length Leff in devices according to this invention compared to conventional LDD devices having equal N-ion implantation dosages. The FIG. 19 current Ids improvement is more pronounced for shorter length channel devices because their channel's lower resistances are relatively more dominated by the N-LDD region's parasitic resistance. The drain current driveability of the present invention is even more improved in view of the rapid degradation/reduction of current in conventional LDD devices as shown in FIG. 3.

Figure 20:
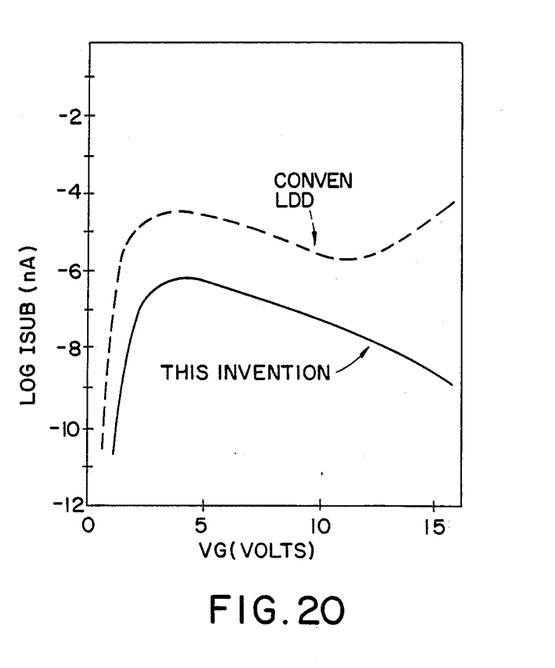
FIG. 20 illustrates the substrate current characteristic of the present invention.
Figure 21:
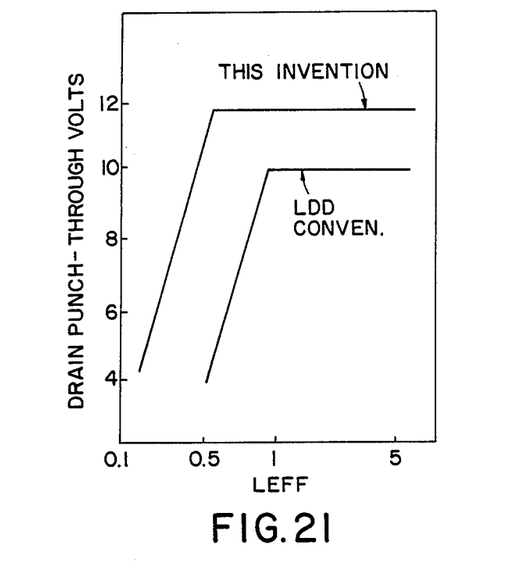
FIG. 21 illustrate the improvement of drain punch-through voltage of the present invention as compared to prior art LDD devices.

In contrast to prior art LDD devices in which insufficient LDD doping concentrations and/or gate-to-source non-overlap cause substrate current Isub "double humps" as shown in FIG. 4, according to the present invention LDD devices 50 and 60 with gate 118a, 118b shorted to conductive poly spacers control the underlying LDD regions and thereby prevent Isub "double humps" as shown in FIG. 20 for conventional LDD devices and for devices according to the present invention, both having reverse-biased sources and drains.

Figure 22:
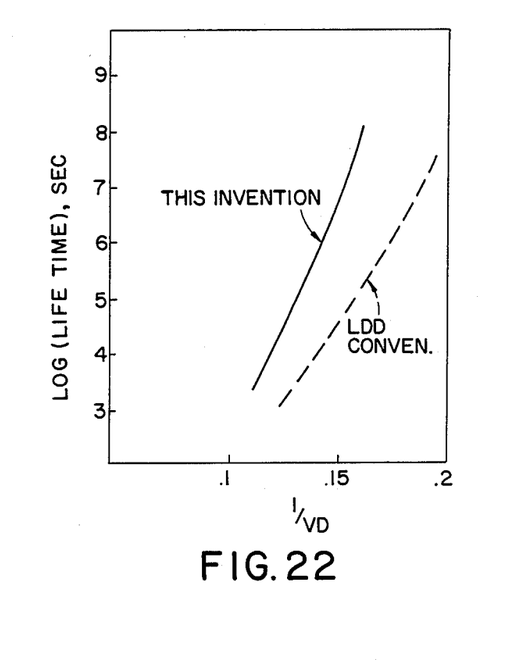
FIG. 22 illustrates device lifetimes for gate controllable LDD devices according to the present invention as compared to prior art LDD devices.

In devices according to this invention, the bipolar effect is substantially suppressed, which raises the drain punch-through voltage. The N-dosage, N-junction depth, polysilicon spacer width and small oxide spacer width can all be optimized to increase the speed and reliability of short (especially submicron) channel MOS devices. Devices according to this invention should have a much longer lifetime than the 10 year lifetime of conventional LDD devices, as shown in FIG. 22.

Although the present invention has been described in terms of two preferred embodiments, it will be appreciated by those skilled in the art that modifications thereof may be made without departing from the essence of the invention. It is therefore intended that the following claims be interpreted as covering any and all such modifications falling within the true spirit and scope of the invention.

We claim:

1. A gate controllable lightly doped drain MOSFET structure comprising:
   a semiconductor substrate of a first conductivity type and including an initial planar upper surface;
   a gate dielectric layer disposed on said surface;
   a gate electrode, including laterally opposite sidewalls, covering said gate dielectric layer;
   a pair of LDD surface dielectric layers disposed on respective areas of said surface adjacent respective sidewalls and having a selected thickness different than the thickness of said gate oxide layer;
   a lightly doped source region and a lightly doped drain region of a second conductivity type having a first concentration of second conductivity type dopant and being formed in respective regions of said substrate beneath corresponding LDD surface dielectric layers and having junctions delimiting a channel in said substrate under said gate electrode;
   a pair of conductive spacers disposed on respective LDD surface dielectric layers over said lightly doped regions and ohmically connected to said gate electrode; and
   a regularly doped source region and a regularly doped drain region of said second conductivity type having a second concentration substantially greater than said first concentration and being formed in said substrate beneath respective areas of said surface adjacent respective LDD surface dielectric layers and contiguous with respective lightly doped source and drain regions 2. A structure as in claim 1 wherein said gate electrode comprises polycrystalline silicon and said dielectric layers comprise oxides of silicon.

3. A structure as in claim 2 wherein said first conductivity type is P-type conductivity and said second conductivity type is N-type conductivity.

4. A structure as in claim 1 wherein a common dielectric layer forms said gate dielectric layer and forms at least part of said surface dielectric layers.

5. A structure as in claim 4 wherein said surface dielectric layers are thinner than said gate dielectric layer.

6. A structure as in claim 5 wherein a supplementary dielectric material forms portions of said surface dielectric layers and forms, over each of said portions, a respective etch stop layer between the corresponding spacer and the adjacent sidewall of the gate, and further comprising silicide disposed over said etch stop layer between said spacers and said gate electrode to provide ohmic connections electrically shorting said gate electrode to each of said spacers.

7. A structure as in claim 6 and further comprising silicide disposed on contact areas of said surface over said regularly doped source and drain regions.

8. A structure as in claim 5 and further comprising a pair of small dielectric spacers disposed on respective LDD surface dielectric layers adjacent the outer sides of corresponding conductive spacers.

9. A gate controllable lightly doped drain MOSFET structure comprising:
- a semiconductor substrate of a first conductivity type and including an initial planar upper surface;
- a gate dielectric layer formed of an oxide of silicon disposed on said surface;
- a gate electrode formed of polysilicon with laterally opposite sidewalls and covering said gate dielectric layer;
- a pair of LDD surface dielectric layers disposed on respective areas of said surface adjacent respective sidewalls;
- a lightly doped source region and a lightly doped drain region of a second conductivity type having a first concentration of second conductivity type dopant and being formed in respective regions of said substrate beneath corresponding LDD surface dielectric layers and having junctions delimiting a channel in said substrate under said gate electrode.
- a pair of conductive polysilicon spacers disposed on respective LDD surface dielectric layers over said lightly doped regions and ohmically connected to said gate electrode; and
- a regularly doped source region and a regularly doped drain region of said second conductivity type having a second concentration substantially greater than said first concentration and being formed in said substrate beneath respective areas of said surface adjacent respective LDD surface dielectric layers and contiguous with respective lightly doped source and drain regions.

* * * * *